United States Patent
Lee et al.

(10) Patent No.: US 9,685,439 B1
(45) Date of Patent: Jun. 20, 2017

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chen-Ming Lee, Yangmei (TW); Liang-Yi Chen, Hsinchu (TW); Fu-Kai Yang, Hsinchu (TW); Mei-Yun Wang, Phu-Pei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/144,395

(22) Filed: May 2, 2016

(51) Int. Cl.
| | |
|---|---|
| *H01L 29/76* | (2006.01) |
| *H01L 29/94* | (2006.01) |
| *H01L 27/088* | (2006.01) |
| *H01L 21/8234* | (2006.01) |
| *H01L 29/08* | (2006.01) |
| *H01L 21/02* | (2006.01) |
| *H01L 29/78* | (2006.01) |
| *H01L 29/165* | (2006.01) |
| *H01L 29/66* | (2006.01) |
| *H01L 29/45* | (2006.01) |

(52) U.S. Cl.
CPC .... *H01L 27/0886* (2013.01); *H01L 21/02057* (2013.01); *H01L 21/02532* (2013.01); *H01L 21/823418* (2013.01); *H01L 21/823431* (2013.01); *H01L 29/0847* (2013.01); *H01L 29/165* (2013.01); *H01L 29/45* (2013.01); *H01L 29/665* (2013.01); *H01L 29/7848* (2013.01)

(58) Field of Classification Search
CPC .......... H01L 27/088; H01L 21/823418; H01L 29/4933; H01L 21/02063; H01L 21/02532
USPC ........................................................ 257/384
See application file for complete search history.

(56) References Cited

U.S. PATENT DOCUMENTS

2010/0264468 A1* 10/2010 Xu .................. H01L 29/66795
   257/288
2015/0279840 A1* 10/2015 Huang ............. H01L 29/66545
   257/384

* cited by examiner

*Primary Examiner* — Theresa T Doan
(74) *Attorney, Agent, or Firm* — McDermott Will & Emery LLP

(57) ABSTRACT

A method for manufacturing a semiconductor device is provided, including forming a plurality of fins on a semiconductor substrate, and forming source/drain regions on the fins. The source/drain regions have an uneven surface with a mean surface roughness, $R_a$, of about 10 nm to about 50 nm. A smoothing layer is formed on the source/drain regions filling the uneven surface. An etch stop layer is formed overlying the smoothing layer. A portion of the etch stop layer is removed to expose a portion of the smoothing layer. The exposed smoothing layer is removed, and a contact layer is formed on the source/drain regions.

20 Claims, 14 Drawing Sheets

SEMICONDUCTOR DEVICE AND MANUFACTURING METHOD THEREOF

TECHNICAL FIELD

The disclosure relates to a semiconductor integrated circuit, and more particularly to a semiconductor device having an epitaxial source/drain (S/D) structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Examples of devices that can benefit from one or more embodiments of the present disclosure are semiconductor devices. Such a device, for example, is a FinFET device. FinFETs are field effect transistors formed on fin structures formed over a substrate. In some embodiments, the fins are formed in an array. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will include a FinFET example to illustrate various embodiments of the present application. It is understood, however, that the application should not be limited to a particular type of device, except as specifically claimed.

Figure 1:
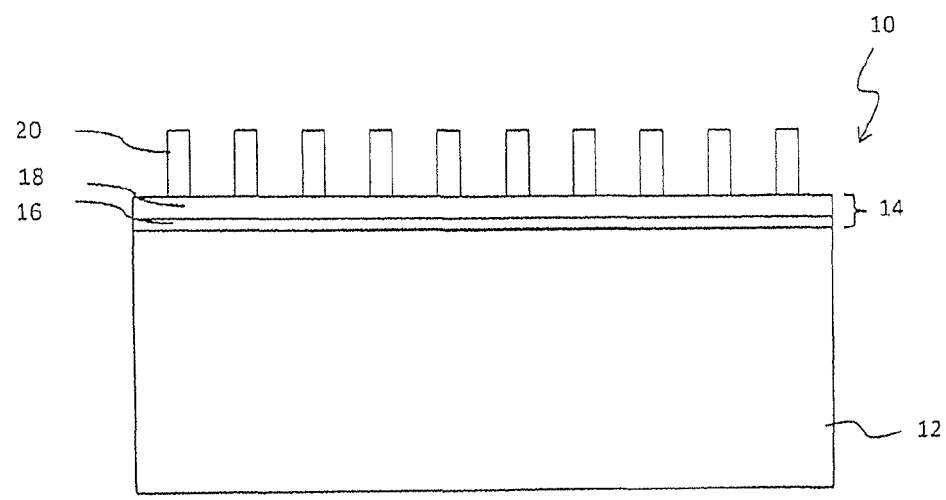
FIGS. 1-19 show an exemplary process for manufacturing a semiconductor device according to an embodiment of the present disclosure.

To fabricate a semiconductor device 10 according to an embodiment of the present disclosure including one or more fins, a mask layer 14 is formed over a substrate 12, as illustrated in FIG. 1. The mask layer 14 is formed by, for example, a thermal oxidation process and/or a chemical vapor deposition (CVD) process. The substrate 12 is, for example, a P-type silicon substrate with an impurity concentration in a range of about $1 \times 10^{15}$ cm$^{-3}$ to about $2 \times 10^{15}$ atoms cm$^{-3}$. In other embodiments, the substrate 12 is an N-type silicon substrate with an impurity concentration in a range of about $1 \times 10^{15}$ cm$^{-3}$ to about $2 \times 10^{15}$ atoms cm$^{-3}$. The mask layer 14 includes, for example, a pad oxide (e.g., silicon oxide) layer 16 and a silicon nitride mask layer 18 in some embodiments.

Alternatively, the substrate 12 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 12 is a silicon layer of an SOI (silicon-on insulator) substrate. Amorphous substrates, such as amorphous Si or amorphous SiC, or insulating material, such as silicon oxide may also be used as the substrate 12. The substrate 12 may include various regions that have been suitably doped with impurities (e.g., P-type or N-type conductivity).

The pad oxide layer 16 may be formed by using thermal oxidation or a CVD process. The silicon nitride mask layer 18 may be formed by a CVD, plasma-enhanced chemical vapor deposition (PECVD), an atmospheric pressure chemical vapor deposition (APCVD), a low-pressure CVD (LP-CVD), a high density plasma CVD (HDPCVD), an atomic layer deposition (ALD), a physical vapor deposition (PVD), such as a sputtering method, and/or other processes.

The thickness of the pad oxide layer 16 is in a range of about 2 nm to about 15 nm and the thickness of the silicon nitride mask layer 18 is in a range of about 2 nm to about 50 nm in some embodiments. A mask pattern 20 is further formed over the mask layer 14. The mask pattern 20 is, for example, a resist pattern formed by lithography operations.

By using the mask pattern 20 as an etching mask, a hard mask pattern of the pad oxide layer 16 and the silicon nitride mask layer 18 is formed. The width of the hard mask pattern is in a range of about 5 nm to about 40 nm in some embodiments. In certain embodiments, the width of the hard mask patterns is in a range of about 7 nm to about 12 nm.

Figure 2:
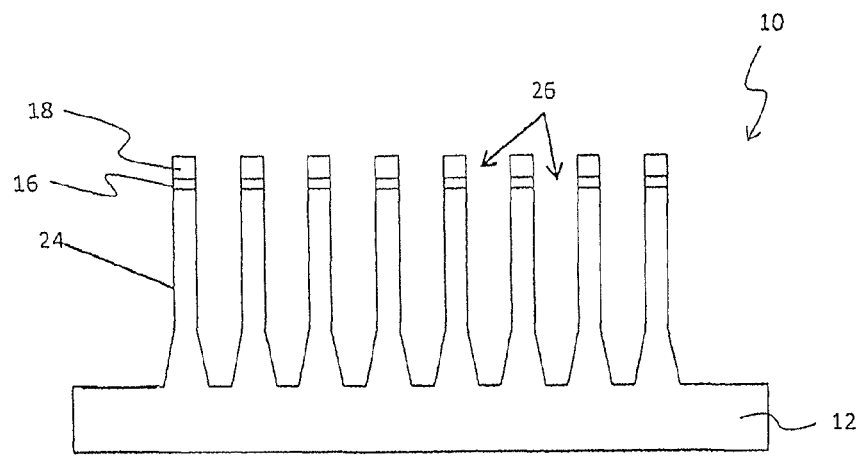

By using the hard mask pattern as an etching mask, the substrate 12 is patterned into a plurality of fins 24, as shown in FIG. 2, by trench etching using a dry etching method and/or a wet etching method to form trenches 26. A height of the fins 24 is in a range of about 20 nm to about 300 nm. In certain embodiments, the height is in a range of about 30 nm to about 60 nm. When the heights of the fins 24 are not uniform, the height from the substrate may be measured from the plane that corresponds to the average heights of the fins 24. The width of each of the fins 24 is in a range of about 7 nm to about 15 nm.

In this embodiment, a bulk silicon wafer is used as the substrate 12. However, in some embodiments, other types of substrates may be used as the substrate 12. For example, a silicon-on-insulator (SOI) wafer may be used as a starting material, and the insulator layer of the SOI wafer constitutes the substrate 12 and the silicon layer of the SOI wafer is used for the fins 24.

As shown in FIG. 2, eight fins 24 are disposed over the substrate 12. However, the number of fins is not limited to eight. There may be as few as one fin and more than eight fins. In addition, one or more dummy fins may be disposed adjacent to the sides of the fins to improve pattern fidelity in the patterning processes. The width of each fin 24 is in a range of about 5 nm to about 40 nm in some embodiments, and in a range of about 7 nm to about 15 nm in other embodiments. The width of trenches 26 between adjacent fins is in a range of about 5 nm to about 80 nm in some embodiments, and in a range of about 7 nm to about 15 nm in other embodiments. One skilled in the art will realize, however, that the dimensions and values recited throughout the descriptions are merely exemplary, and may be changed to suit different scales of integrated circuits.

Figure 3:
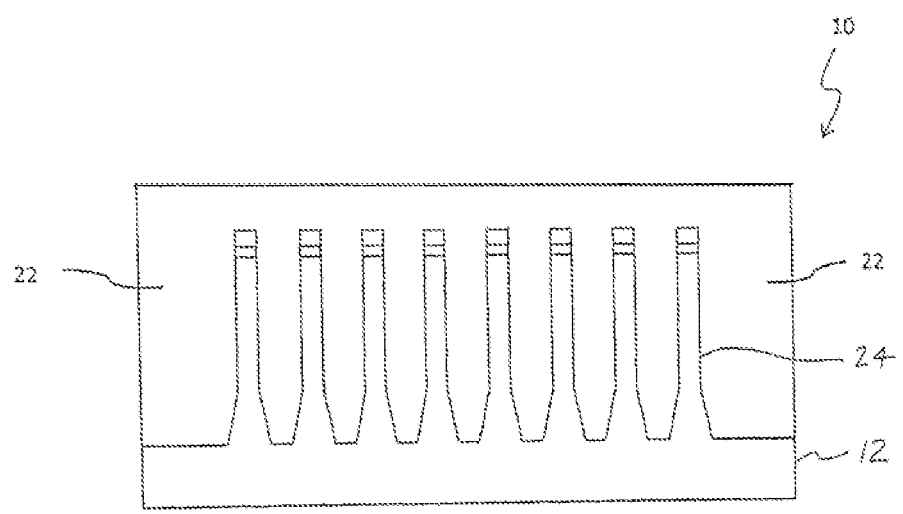

After forming the fins 24, an isolation insulating layer 22 is formed in trenches 26 between the fins 24 and overlying the fins 24, so that the fins 24 are buried in isolation insulating layer 22, as illustrated in FIG. 3. The isolation insulating layer 22 is also referred to as shallow trench insulation (STI).

The isolation insulating layer 22 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 22 is formed by one or more layers of SOG, SiO, SiON, SiOCN, and/or fluorine-doped silicate glass (FSG) in some embodiments.

Figure 4:
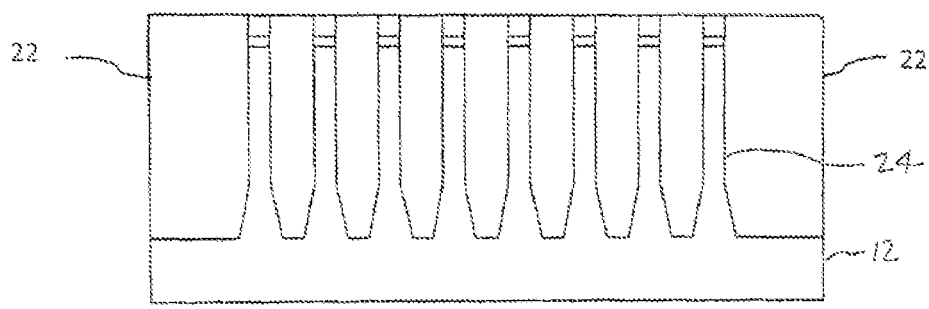

A planarization operation is performed so as to remove part of the isolation insulating layer 22, as illustrated in FIG. 4. The planarization operation may include a chemical mechanical polishing (CMP) and/or an etch-back process.

Figure 5:
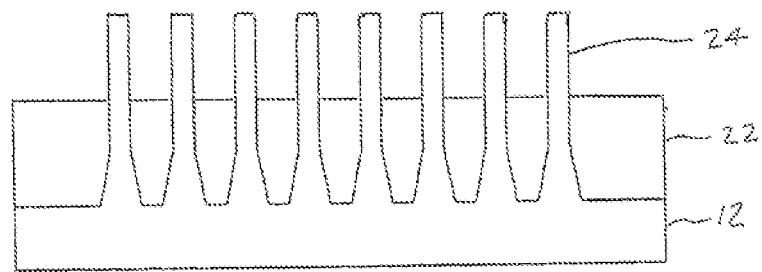

The mask layer 14 may be removed, and an upper portion of the isolation insulating layer 22 is further removed so that the channel region (upper portion) of the fins 24 is exposed, as shown in FIG. 5.

In certain embodiments, removal of the mask layer 14 and partially removing the isolation insulating layer 22 are performed using a suitable etching process. For example, the mask layer 14 may be removed by a wet etching process, such as, by dipping the substrate in hydrofluoric acid (HF) or phosphoric acid ($H_3PO_4$). On the other hand, the partially removing the isolation insulating layer 22 may be performed using a dry etching process. For example, a dry etching process using $CHF_3$ or $BF_3$ as etching gases may be used.

Figure 6:
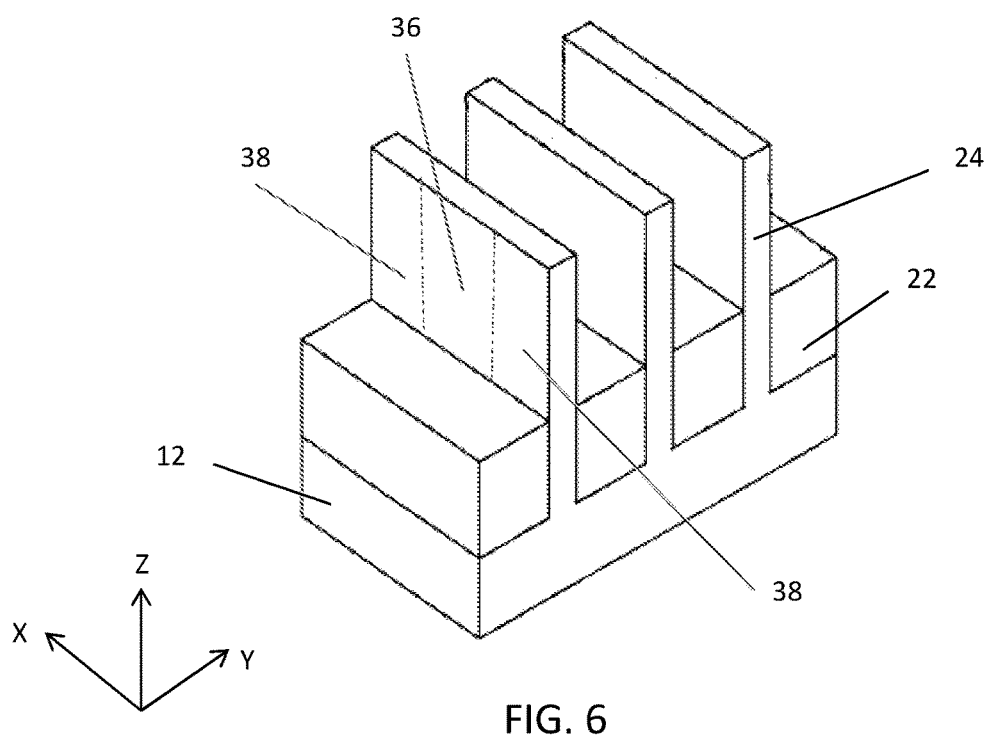

An isometric view of the device 10 showing the fins 24 exposed from the isolation insulating layer 22 is depicted in FIG. 6. To simplify the disclosure, only three fins are shown in FIG. 6. The exposed portions of the fins 24 comprise two regions. A first region 36 in a central portion of the fin 24 is where a gate structure will be formed, and a second region 38 at the peripheral portions of the fin 24 is where source/drain regions will be formed. In the present disclosure, a source and a drain are interchangeably used, and the term source/drain refers to either one of a source and a drain.

Figure 7:
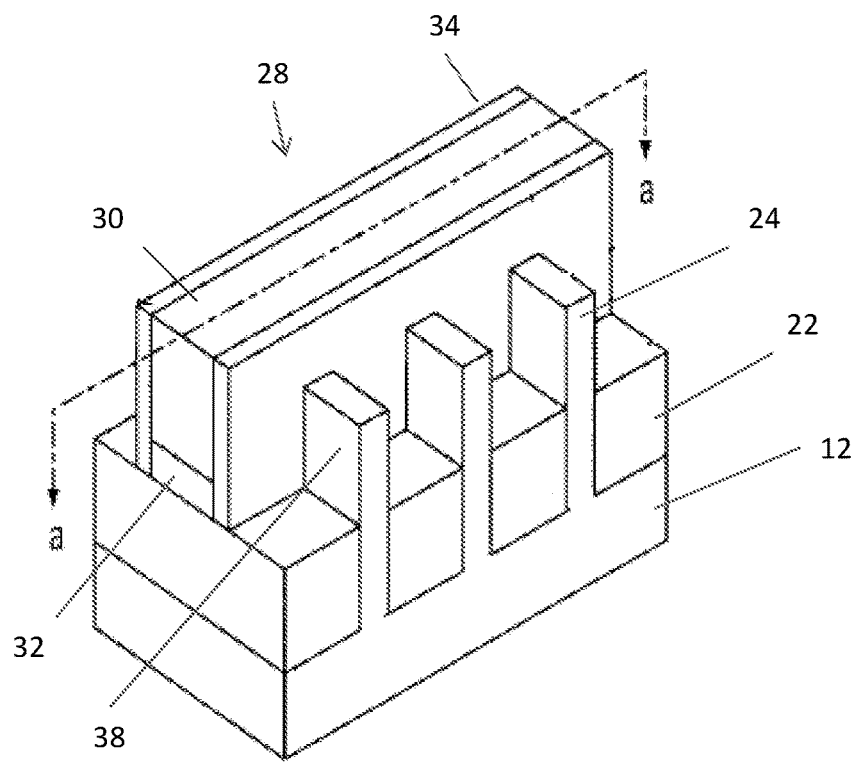
Figure 8:
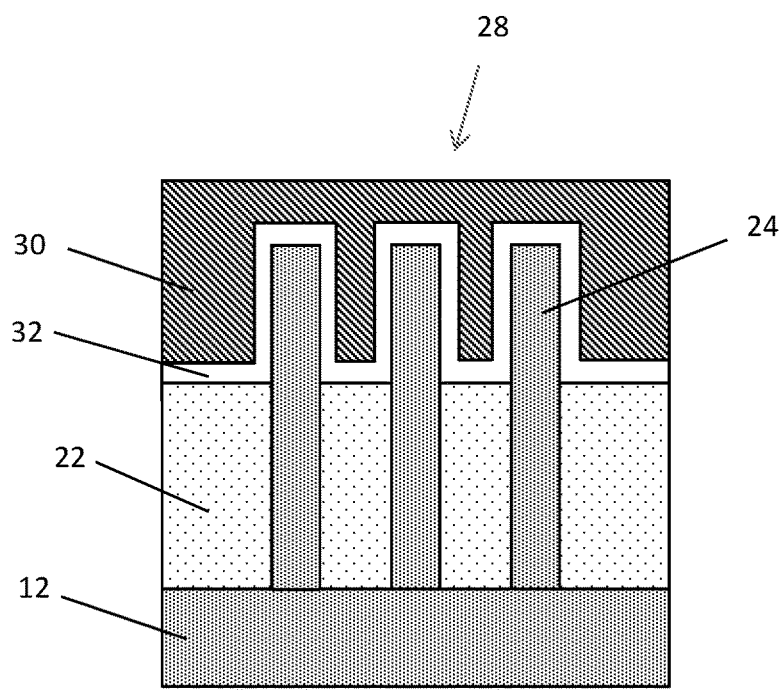

A gate structure 28 is subsequently formed over the first region 36 of the fins, as shown in FIG. 7. The gate structure formation process may include the operations of depositing a gate dielectric 32, depositing a gate electrode 30, patterning the gate electrode, lightly doped drain (LDD) implantation, and annealing. Sidewall spacers 34 are subsequently formed on the gate structure 28, and source/drain formation, implantation, and annealing are performed in subsequent operations. FIG. 8 corresponds to a cross section taken along line A-A of FIG. 7, showing the arrangement of the fins 24 and the gate electrode structure 28.

The gate dielectric 32 may comprise one or more layers of silicon oxide, silicon nitride, silicon oxynitride, high-k dielectric material, other suitable dielectric material, and/or combinations thereof. The gate electrode 30 in certain embodiments is formed of polysilicon and may include a hard mask formed over the gate electrode. The hard mask may be made a suitable hard mask material, including $SiO_2$, SiN, or SiCN. In some embodiments, a thickness of the gate dielectric layer is in a range of about 5 nm to about 20 nm, and in a range of about 5 nm to about 10 nm in other embodiments. The gate electrode structure may comprise additional layers such as interfacial layers, capping layers, diffusion/barrier layers, dielectric layers, conductive layers, and other suitable layers, and combinations thereof. In addition to polysilicon, in some embodiments, the gate electrode 30 includes one or more layers of any other suitable material, such as aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, or combinations thereof. In some embodiments, a thickness of the gate electrode layer is in a range of about 50 nm to about 400 nm, and is in a range of about 100 nm to 200 nm in other embodiments.

In certain embodiments, the FinFET can be fabricated using a gate first method or a gate last method. In embodiments using a high-k dielectric and a metal gate (HK/MG), a gate last method is employed to form the gate electrode. In the gate last method, a dummy gate is formed, the dummy gate is subsequently removed at a later operation after a high temperature annealing operation, and the high-k dielectric and a metal gate (HK/MG) is formed.

According to embodiments of the disclosure, the high-k gate dielectric may comprise one or more layers of $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The metal gate material may comprise one or more layers of Ti, TiN, titanium-aluminum alloy, Al, MN, Ta, TaN, TaC, TaCN, TaSi, and the like.

In some embodiments, the sidewall spacers 34 are used to offset subsequently formed doped regions, such as source/drain regions. The sidewall spacers 34 may further be used for designing or modifying the source/drain region (junction) profile. The sidewall spacers 34 may be formed by suitable deposition and etch techniques, and may comprise one or more layers of silicon nitride, silicon oxide, silicon carbide, silicon oxynitride, silicon carbon oxynitride, other suitable materials, or combinations thereof.

A blanket layer of a sidewall insulating material may be formed by CVD, PVD, ALD, or other suitable technique. Then, an anisotropic etching is performed on the side-wall insulating material to form a pair of sidewall insulating layers (spacers) 34 on two main sides of the gate structure 28. The thickness of the sidewall insulating layers 34 is in a range of about 5 nm to about 30 nm in some embodiments, and in a range of about 10 nm to about 20 nm in other embodiments. As shown in FIG. 7, in an embodiment, the side wall insulating layer is not formed over the regions of the fin that is to become the source/drain regions.

Figure 9:
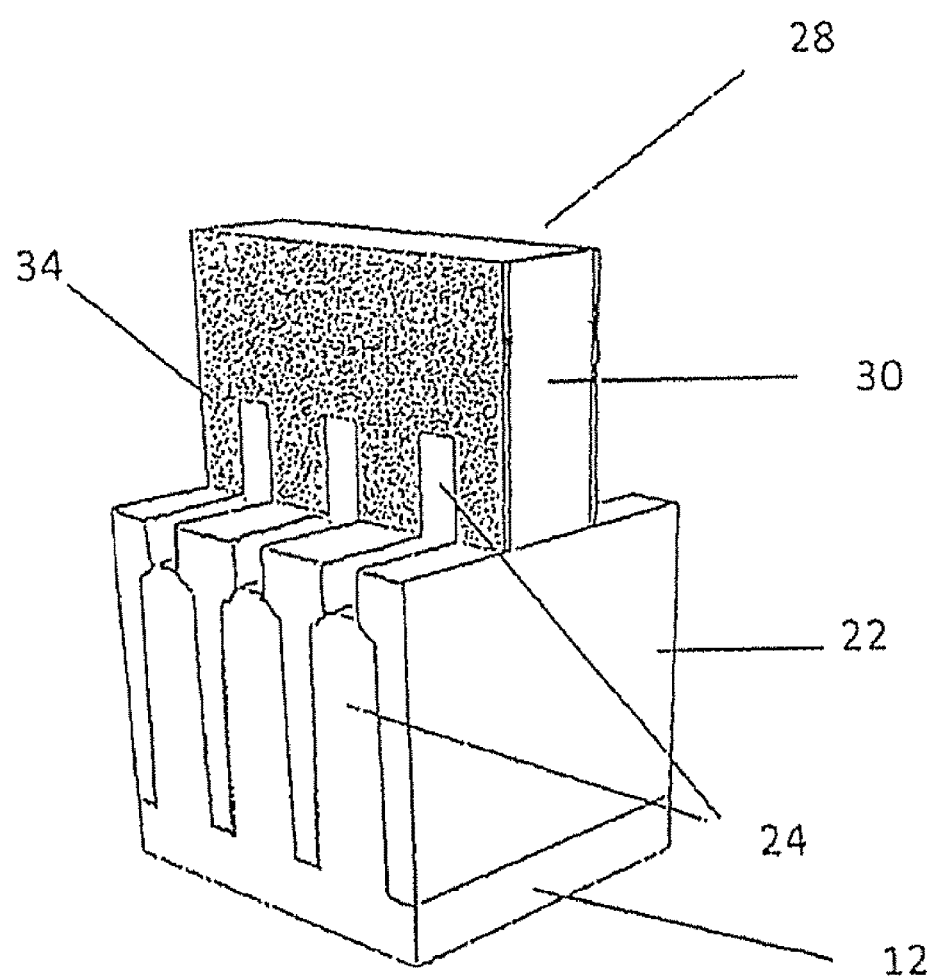

The second region 38 of the fins not covered with the gate structure 28 are subsequently etched to remove the portion of the fins above the STI region 22, as shown in FIG. 9. Suitable photolithographic and etching techniques can be used to remove the second region 38 of the fins.

Figure 10:
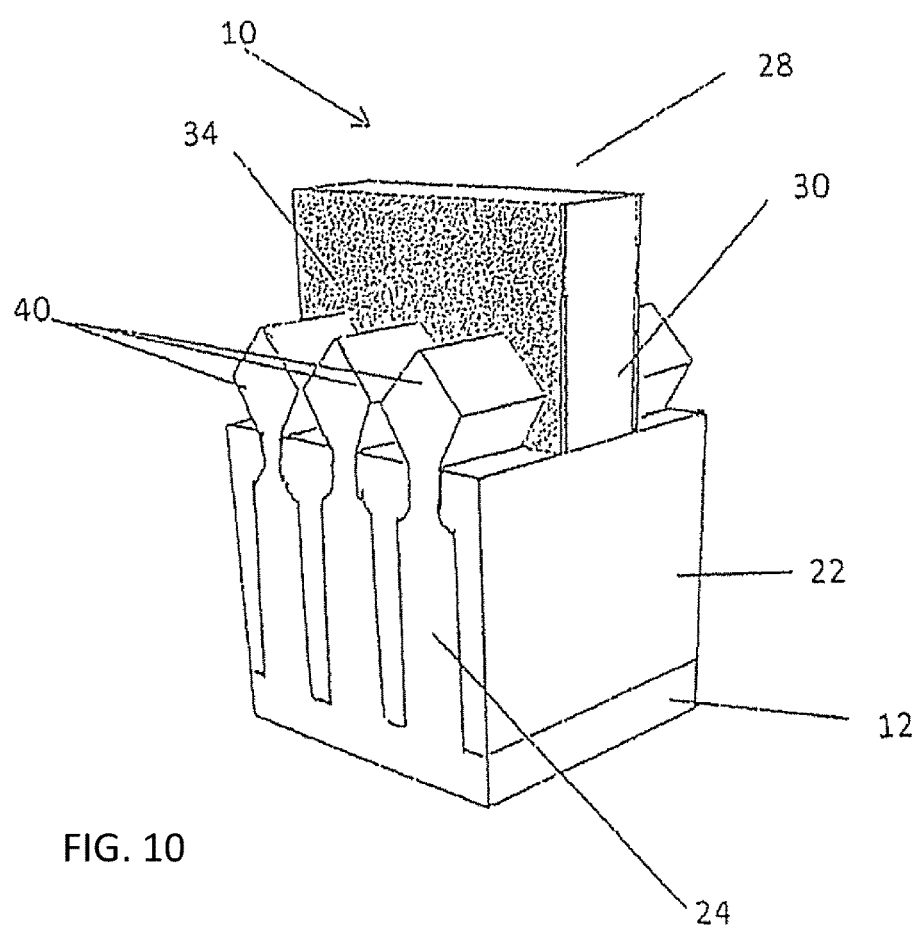

In certain embodiments, raised source/drain regions 40 are subsequently formed overlying the etched portion of the fins 24, as shown in FIG. 10, providing a FinFET semiconductor device 10. The raised source/drain regions may be formed by one or more epitaxy or epitaxial (epi) processes, such that one or more of Si features, SiC features, SiGe features, SiP features, SiCP features, or Group III-V semiconductor material on Si EPI or other suitable features are formed in a crystalline state on the fins. The epitaxy processes include CVD deposition techniques (e.g., vapor-phase epitaxy (VPE) and/or ultra-high vacuum CVD (UHV-CVD)), molecular beam epitaxy, and/or other suitable processes.

In certain embodiments, the epitaxial growth of the source/drain regions is continued until the individual source/drain regions merge together to form a FinFET semiconductor device with merged source/drain regions.

In some embodiments of the disclosure, source/drain electrodes are formed contacting the respective source/drain regions. The electrodes may be formed of a suitable conductive material, such as copper, tungsten, nickel, titanium, or the like. In some embodiments, a metal silicide is formed at the conductive material and source/drain interface to improve conductivity at the interface. In one example, a damascene and/or dual damascene process is used to form copper-based multilayer interconnection structures. In some embodiments, metal plugs are formed contacting the source/drain regions. In certain embodiments, tungsten is used to form tungsten plugs.

To reduce contact resistance between metal plugs and the source/drain regions and source/drain electrodes an increased contact surface area is desirable. As shown in FIG. 10, the source/drain regions 40 have an uneven surface, including peaks and valleys, thereby increasing the surface area of the source/drain regions 40 in contrast to a substantially planar surface.

Figure 11:
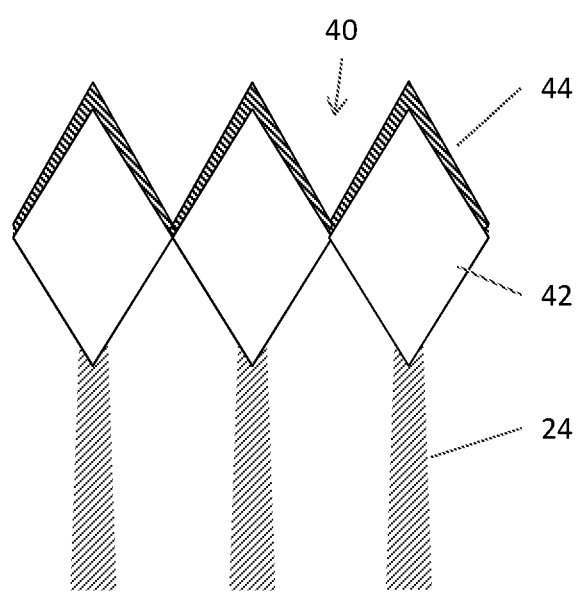

In some embodiments, source/drain regions 40 comprise two different materials. For example, in a p-channel transistor, as shown in FIG. 11, a first portion 42 of the source/drain regions 40 comprises SiGe having a first Ge content and a second portion 44 comprising SiGe having a second Ge content where the first Ge content is greater than the second Ge content. In order to simplify the disclosure, only the source/drain regions and the fins are illustrated. The first portion 42 may be a stressed region to facilitate carrier flow in the source/drain region. The second portion 44 may be a protective layer to protect the stressed region during subsequent processing. In certain embodiments, the second portion 44 has a thickness ranging from 1 nm to 5 nm, in other embodiments the thickness of the second portion 44 is within the range of 1 nm to 2 nm. In certain embodiments, the Ge content in the first portion 42 ranges from 50 atomic % to 65 atomic %, and the Ge content in the second portion ranges from 15 atomic % to 20 atomic %.

In certain embodiments, to reduce contact resistance between the source/drain electrode and the source/drain region, a silicide layer is formed on the source/drain regions. A silicide layer is formed by depositing a film of a suitable metal, such as cobalt, nickel, or titanium, on the source/drain regions and applying heat to cause a silicidation reaction between the deposited metal and the underlying source/drain region. However, if there is residual contact etch stop layer (CESL) on the source/drain regions from prior semiconductor fabrication operations, the silicide layer cannot be formed on the source/drain at these locations, thereby reducing the contact area between a subsequently formed source/drain electrode and the source/drain regions. In addition, when attempting to completely remove the CESL overetching of upper portions of the source/drain regions may occur, thereby flattening the uneven surface of the source/drain regions, and reducing the surface area of the source/drain regions.

Figure 12:
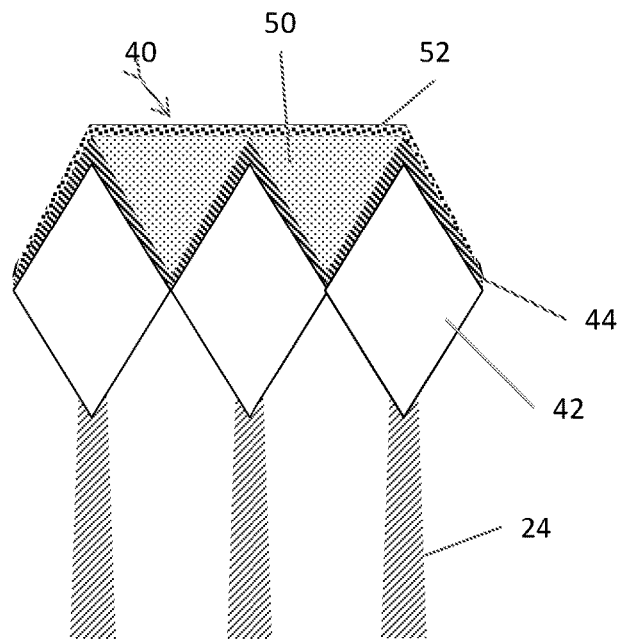

The loss of contact area between source/drain electrodes and the source/drain regions and flattening of the uneven source/drain regions can be prevented by semiconductor device manufacturing operations according to embodiments of the present disclosure. As shown in FIG. 12, a smoothing layer 50 is deposited on the uneven source/drain regions 40. The smoothing layer 50 fills the uneven surface, thereby substantially planarizing the source/drain regions 40. The smoothing layer 50 can be made of germanium. A germanium layer formed by an epitaxy process forms a smooth surface without any additional planarizing operations. In certain embodiments, an intermediate layer 52 is formed overlying the smoothing layer 50 to protect the smoothing layer 50 during subsequent processing. The intermediate layer 52 may be a SiGe layer having a Ge content of 15 atomic % to 20 atomic %.

Figure 13:
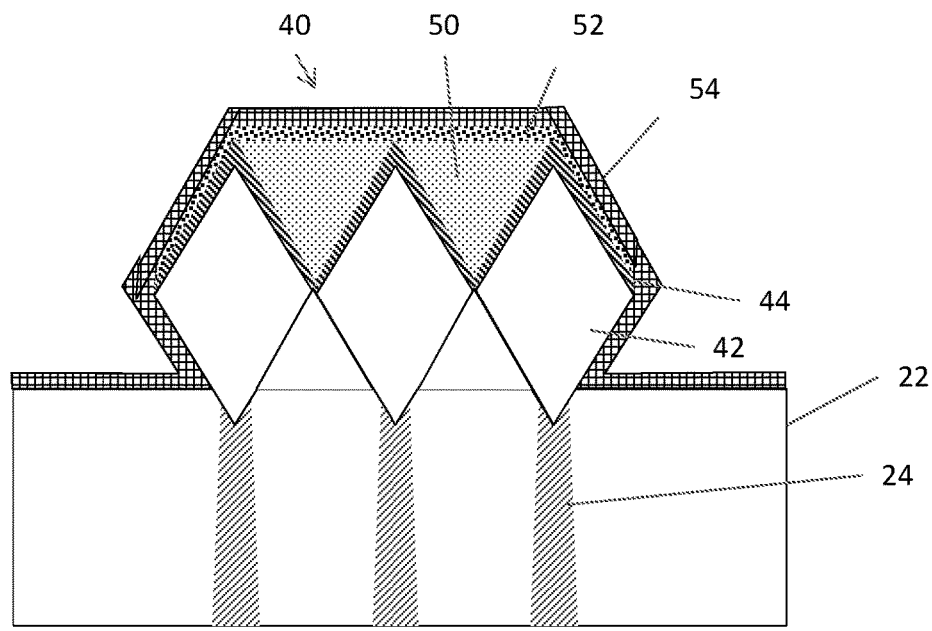

A CESL 54 is subsequently formed overlying the source/drain regions 40, as shown in FIG. 13. The CESL 54 comprises material with good etch selectivity between the CESL material and overlying materials. The CESL 54 may comprise a nitride, such as SiN, SiON, or SiCN. The CESL 54 may be formed by CVD, PECVD, APCVD, LPCVD, HDPCVD, ALD, PVD, such as a sputtering method, and/or other processes. The CESL 54 may also be called a B-CESL for a bottom contact etch stop layer. The B-CESL is formed on the source/drain regions 40 rather than the top of the gate electrode structure 28 (top-CESL) or sides of the gate electrode structure 28 (lateral-CESL). In FIGS. 13-19, the isolation insulating layer 22 is shown to better illustrate the following operations of this embodiment.

Figure 14:
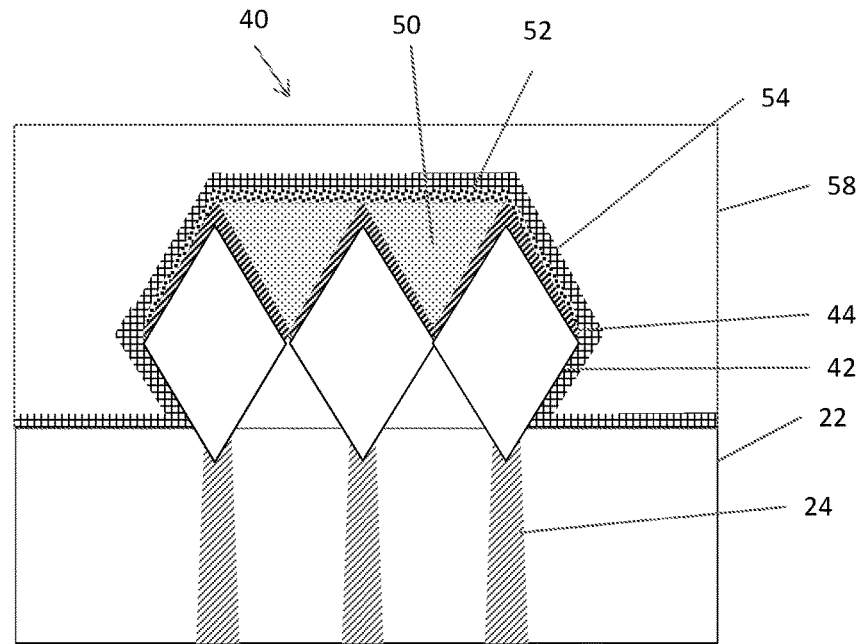

An interlayer dielectric (ILD) 58 is subsequently formed over the FinFET, as shown in FIG. 14 in some embodiments. The ILD 58 may comprise a silicon oxide deposited by a suitable by suitable deposition technique, such as flowable CVD.

Figure 15:
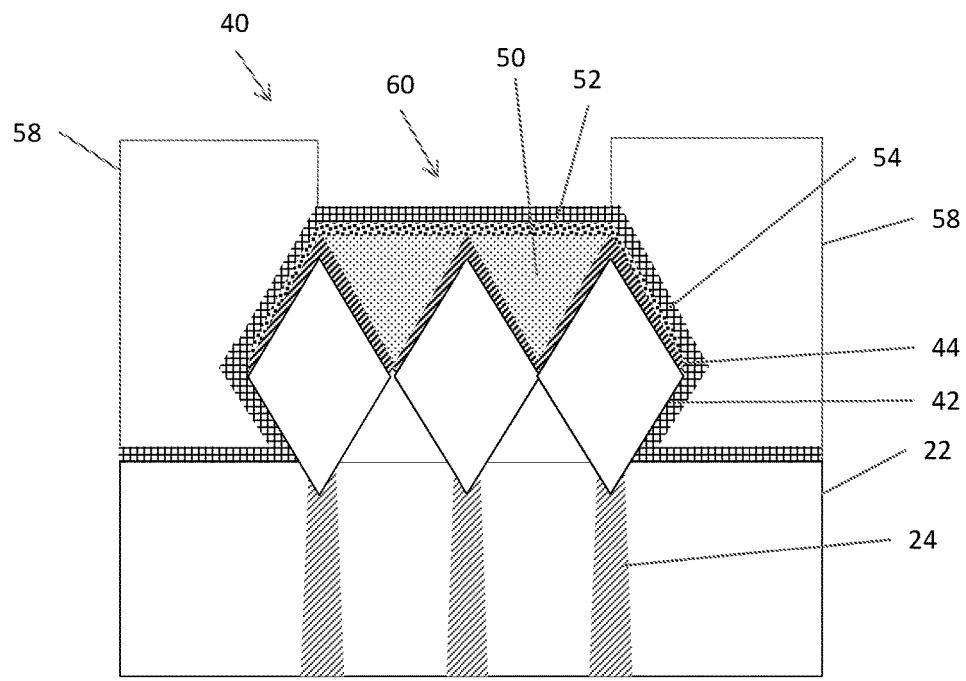

Adverting to FIG. 15, an opening 60 is subsequently formed overlying a portion of the source/drain regions 40 using suitable lithographic and etching techniques.

Figure 16:
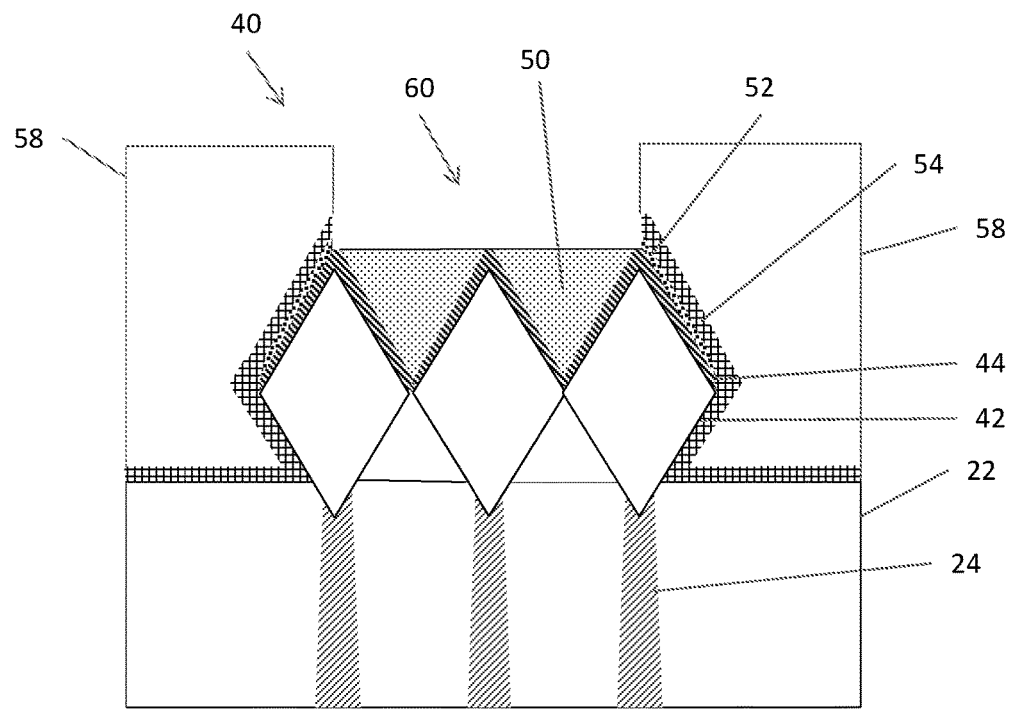

The CESL 54 is completely removed in the opening 60 using a self-aligned contact etch operation without leaving a residue or flattening the source/drain regions 40, as shown in FIG. 16. The optional intermediate layer 52 is also removed during the self-aligned contact etch operation. The CESL 54 may be etched by various methods, including a dry etch, a wet etch, or a combination of dry etch and wet etch. The dry etching process may implement fluorine-containing gas (e.g., $CF_4$, $SF_6$, $NF_3$, $CH_2F_2$, $CHF_3$, and/or $C_4F_8$), chlorine-containing gas (e.g., $CCl_2F_2$, oxygen-containing gas, other suitable gases and/or plasmas, or combinations thereof. In certain embodiments, $CF_4$ is used as a dry etching gas to inhibit polymer etch residue formation.

Figure 17:
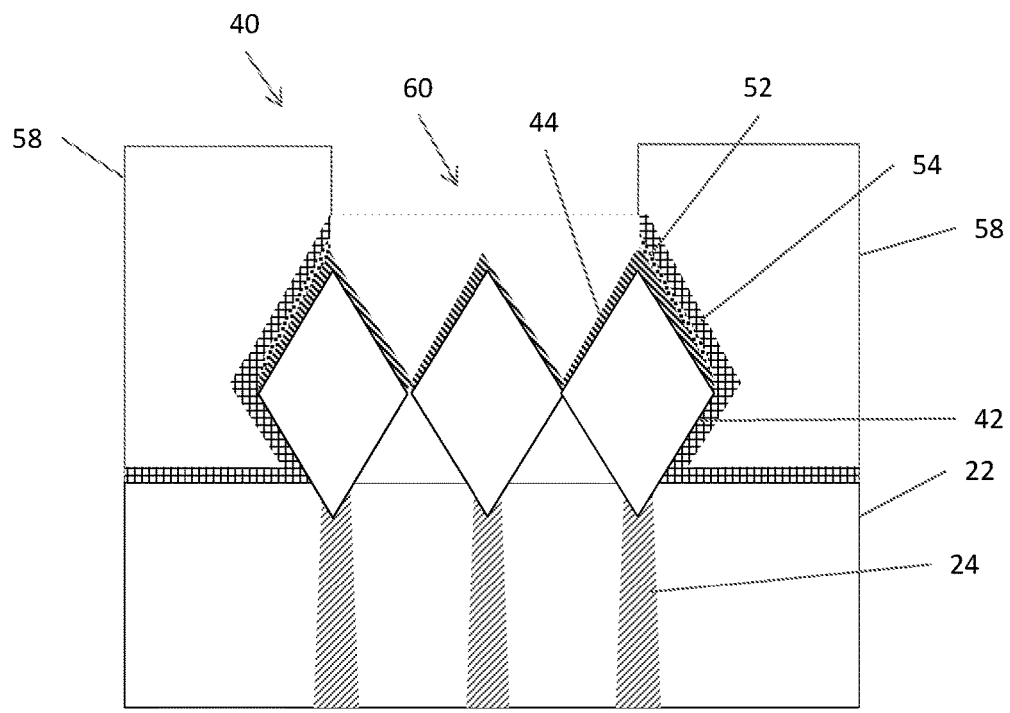

The smoothing layer 50 is subsequently removed, as shown in FIG. 17. The smoothing layer can be removed by a wet clean operation. For example, when the smoothing layer is made of Ge, a solution of sulfuric acid and hydrogen peroxide heated to about 80° C. can be used to completely remove the smoothing layer leaving substantially no residue to interfere with subsequent silicide layer formation remaining on the source/drain regions 40. The wet clean operation oxidizes the germanium and dissolves the oxidized germanium.

Figure 18:
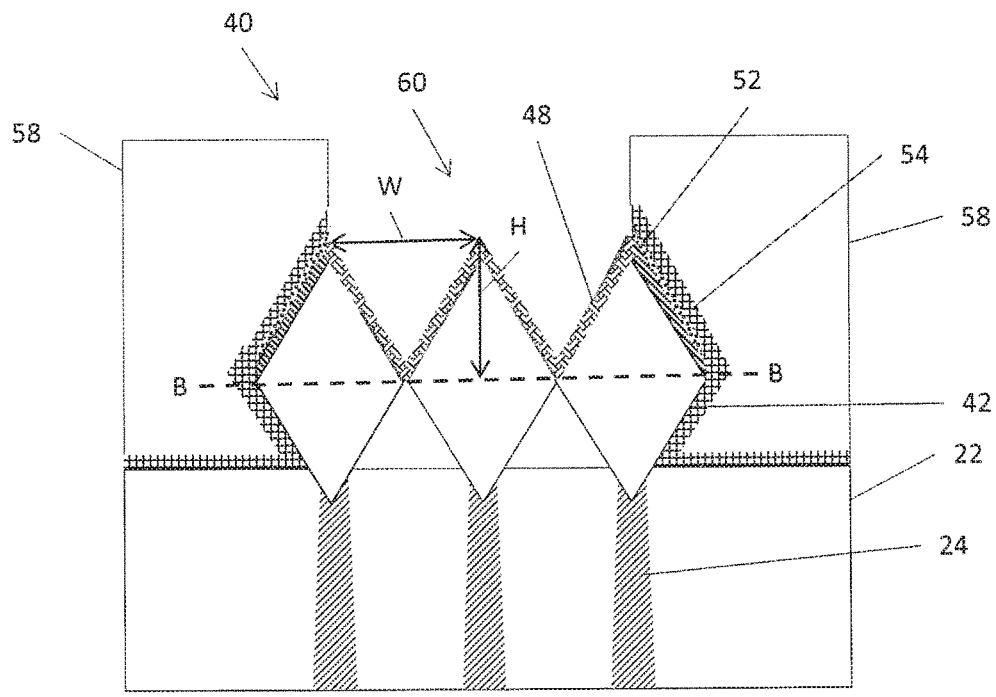

A silicide layer 48 is formed by depositing a film of a suitable metal, such as cobalt, nickel, or titanium, on the source/drain regions 40 and applying heat to cause a silicidation reaction between the deposited metal and the underlying source/drain region 40. During the silicidation a portion of the source/drain region is consumed during the reaction. For example, as shown in FIG. 18, the second portion 44 of the source/drain region 40 reacts with the deposited metal to form the metal silicide layer 48, in some embodiments. In certain embodiments, the second portion 44 and part of the first portion 42 of the source/drain region 40 is consumed by the reaction with the deposited metal to form the metal silicide layer 48.

Because the CESL is completely removed, the silicide layer 48 is formed on the entire exposed surface of the source/drain regions 40, increasing the contact surface area and reducing the contact resistance between a subsequently formed source/drain electrode and the source/drain regions. In addition, flattening of the source/drain regions is prevented while substantially completely removing the CESL.

In some embodiments, the resulting source/drain regions 40 have a mean surface roughness, $R_a$, of 10 nm to about 50 nm when the silicide layer 48 is formed according to the present disclosure. As shown in FIG. 18, unevenness is ideally depicted as a sawtooth wave, the actual surface profile, however, may vary from the sawtooth configuration. The height H of the sawtooth wave source/drain regions 40 is measured from the bottom of a trough B-B formed by the source/drain regions 40 to a peak of the silicide layer 48. The mean surface roughness is calculated from the following equation:

$$R_a = \frac{1}{n}\sum_{i=1}^{n}|y_i|$$

where y is the height H and i is the number of measurements of H. In certain embodiments, the mean surface roughness $R_a$ is about 10 nm to about 15 nm.

In some embodiments, the ratio of the width W between adjacent peak heights of the silicide layer 48 of the source/drain regions 40 to the height H of the peak heights (W/H) ranges from 5 to 1. In certain embodiments, the ratio of the width W to the height H (W/H) ranges from 3 to 2.

Figure 19:
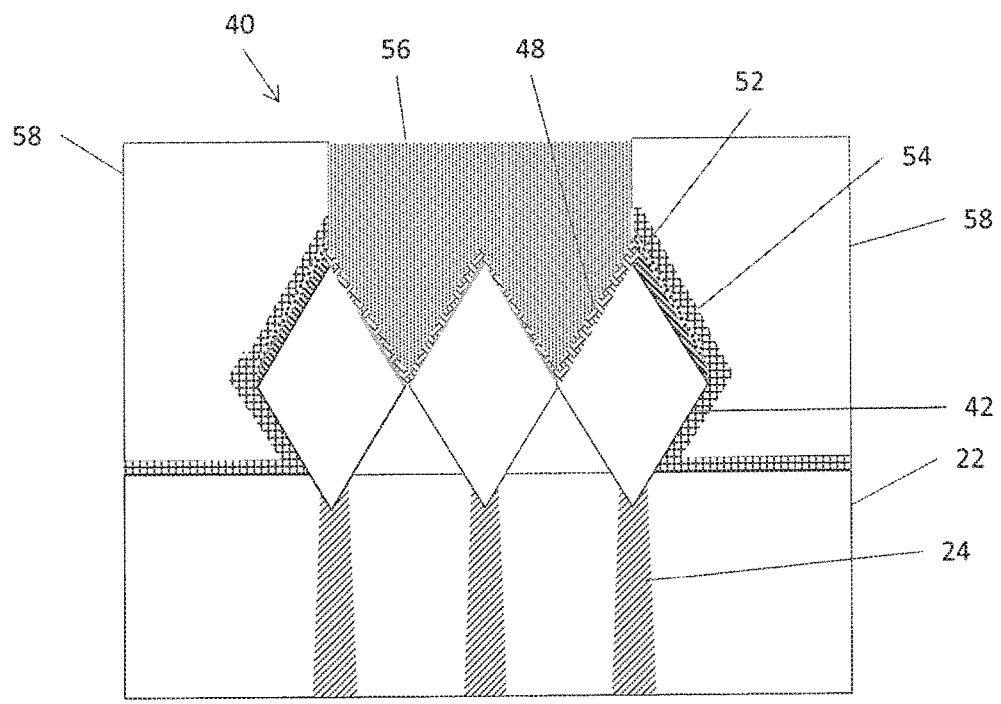

Source/drain electrodes 56 are subsequently formed contacting the respective source/drain regions 40 via the silicide layer 48, as shown in FIG. 19. The electrodes may be formed by depositing a suitable conductive material, such as cobalt, nickel, titanium, tungsten or the like. The first conductive material can be deposited by CVD, PVD, ALD, electroplating or other suitable methods. In some embodiments, a damascene and/or dual damascene process is used to form copper-based multilayer interconnection structures. In another embodiment, tungsten is used to form tungsten plugs.

Figure 20:
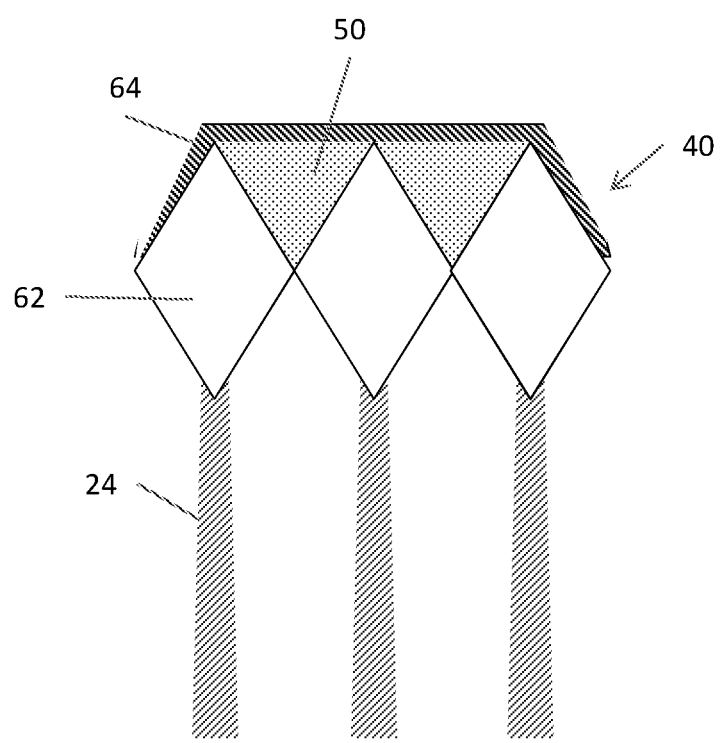
FIG. 20 shows a source/drain region according to another embodiment of the present disclosure.

The embodiments disclosed herein were directed to P-type epitaxially formed source/drain regions. In other embodiments, N-type epitaxial source/drain regions are formed. For example, as shown in FIG. 20, in an embodiment of forming a semiconductor device the source/drain regions 62 comprise SiP or SiCP. A smoothing layer 50 comprising Ge fills the uneven surface of the source/drain regions 62, and an intermediate layer 64 comprising Si is formed overlying the smoothing layer 50 to protect the smoothing layer 50. The subsequent steps of forming a CESL, removing the CESL and smoothing layer, forming the silicide layer, and forming source/drain electrodes are the same as previously disclosed in FIGS. 12-19.

Subsequent processing according to embodiments of the disclosure may also form various contacts/vias/lines and multilayer interconnects features (e.g., metal layers and interlayer dielectrics) on the semiconductor substrate, configured to connect the various features or structures of the FinFET device. For example, a multilayer interconnection includes vertical interconnects, such as conventional vias or contacts, and horizontal interconnects, such as metal lines.

One embodiment of the disclosure is a method for manufacturing a semiconductor device, including forming a plurality of fins on a semiconductor substrate, and forming source/drain regions on the plurality of fins. The source/drain regions have an uneven surface with a mean surface roughness, $R_a$, of about 10 nm to about 50 nm. A smoothing layer is formed on the source/drain regions filling the uneven surface. An etch stop layer is formed overlying the smoothing layer. A portion of the etch stop layer is removed to expose a portion of the smoothing layer. The exposed smoothing layer is removed, and a contact layer is formed on the source/drain regions.

In another embodiment of the disclosure, a method for manufacturing a semiconductor device includes forming a plurality of fins on a semiconductor substrate and forming source/drain regions on the fins. A germanium layer is formed on the source/drain regions filling the uneven surface. A first intermediate layer is formed on the germanium layer. An etch stop layer is formed on the intermediate layer. An interlayer dielectric is formed overlying the source/drain regions. An opening is formed in the interlayer dielectric over a portion of the source/drain regions. A portion of the etch stop layer and the first intermediate layer in the opening are removed exposing a portion of the germanium layer. The exposed portion of the germanium layer is removed by a wet clean operation, and a contact layer is formed on the source/drain regions. The source/drain regions have an uneven surface having a ratio of a width W between adjacent peak heights of the source/drain regions to a height H of the peak heights (W/H) ranging from 5 to 1.

In yet another embodiment of the disclosure, a semiconductor device includes a plurality of fins formed on a semiconductor substrate. Merged source/drain regions are disposed on the fins. The source/drain regions have an uneven surface with a mean surface roughness, $R_a$, of about 10 nm to about 50 nm. A contact layer is disposed on the source/drain regions. The contact layer covers substantially an entire upper surface of the source/drain regions.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a plurality of fins on a semiconductor substrate;
    forming source/drain regions on said fins,
        wherein the source/drain regions have an uneven surface with a mean surface roughness, $R_a$, of about 10 nm to about 50 nm;
    forming a smoothing layer on the source/drain regions filling the uneven surface;
    forming an etch stop layer overlying the smoothing layer;
    removing a portion of the etch stop layer to expose a portion of the smoothing layer;
    removing the exposed smoothing layer; and
    forming a contact layer on the source/drain regions.

2. The method according to claim 1, wherein the smoothing layer comprises germanium.

3. The method according to claim 1, wherein the source/drain regions comprise SiGe having a first germanium content.

4. The method according to claim 3, further comprising forming a first intermediate layer comprising SiGe having a second germanium content between the source/drain regions and the smoothing layer, wherein the second germanium content is less than the first germanium content.

5. The method according to claim 3, further comprising forming a second intermediate layer comprising SiGe having a third germanium content between the smoothing layer and the etch stop layer, wherein the third germanium content is less than the first germanium content.

6. The method according to claim 1, wherein the smoothing layer is substantially completely removed by a wet cleaning operation.

7. The method according to claim 1, wherein the contact layer is formed by depositing a metal on the source and drain regions and performing a silicidation reaction between the metal and the source/drain regions.

8. The method according to claim 1, wherein the source/drain regions have a mean surface roughness, $R_a$, of about 10 nm to about 15 nm.

9. The method according to claim 8, further comprising forming a silicon layer overlying the smoothing layer.

10. A method for manufacturing a semiconductor device, comprising:
    forming a plurality of fins on a semiconductor substrate;
    forming source/drain regions on the fins,
    forming a germanium layer on the source/drain regions filling the uneven surface;
    forming a first intermediate layer on the germanium layer;
    forming an etch stop layer on the intermediate layer;
    forming an interlayer dielectric overlying the source/drain regions;
    forming an opening in the interlayer dielectric over a portion of the source/drain regions;
    removing a portion of the etch stop layer and the first intermediate layer in the opening exposing a portion of the germanium layer;
    removing the exposed germanium layer by a wet clean operation; and
    forming a contact layer on the source/drain regions,
    wherein the source/drain regions have an uneven surface having a ratio of a width W between adjacent peak heights of the source/drain regions to a height H of the peak heights (W/H) ranging from 5 to 1.

11. The method according to claim 10, wherein the wet clean operation comprises oxidizing the germanium layer and dissolving the oxidized germanium.

12. The method according to claim 10, wherein the source/drain regions comprise SiGe having a first germanium content.

13. The method according to claim 12, wherein the first intermediate layer comprises SiGe having a second germanium content less than the first germanium content.

14. The method according to claim 12, further comprising forming a second intermediate layer comprising SiGe having a third germanium content between the source/drain regions and the smoothing layer, wherein the third germanium content is less than the first germanium content.

15. The method according to claim 10, wherein the germanium layer is substantially completely removed by a wet cleaning operation.

16. The method according to claim 10, wherein the forming a contact layer comprises:
    depositing a metal layer on the source/drain regions; and
    applying heat to the metal layer and source/drain regions to cause a silicidation reaction between metal layer and the source/drain regions.

17. The method according to claim 10, wherein the ratio of the width W between adjacent peak heights of the source/drain regions to the height H of the peak heights (W/H) ranges from 3 to 2.

18. The method according to claim 17, further comprising forming a silicon layer overlying the smoothing layer.

19. A method for manufacturing a semiconductor device, comprising:
    forming a plurality of fins on a semiconductor substrate;
    forming SiGe source/drain regions on the fins,
        wherein the source/drain regions comprise SiGe having a first germanium content, and the source/drain regions have an uneven surface;
    forming a conformal SiGe layer having a second germanium content on the source/drain regions,
        wherein the second germanium content is less than the first germanium content;

forming a germanium layer on the conformal SiGe layer having a second germanium content, the germanium layer filling the uneven surface;

forming an SiGe layer having a third germanium content on the germanium layer, wherein the third germanium content is less than the second germanium content;

forming an etch stop layer on the SiGe layer having the third germanium content;

forming an interlayer dielectric overlying the source/drain regions;

forming an opening in the interlayer dielectric over a portion of the source/drain regions;

removing a portion of the etch stop layer and the SiGe layer having the third germanium content in the opening exposing a portion of the germanium layer;

removing the exposed germanium layer; and forming a contact layer on the source/drain regions.

20. The method according to claim 19, wherein the exposed germanium layer is removed by a wet clean operation comprising oxidizing the germanium layer and dissolving the oxidized germanium.

* * * * *